United States Patent Office 3,627,529
Patented Dec. 14, 1971

3,627,529
PROCESS FOR PREPARING A LITHOGRAPHIC PRINTING PLATE

Victor S. Frank, Silver Spring, Md., and Leon Yeshin, Bedford, England, assignors to W. R. Grace & Co., New York, N.Y.

No Drawing. Filed Oct. 11, 1968, Ser. No. 766,966
Int. Cl. G03f 7/02
U.S. Cl. 96—33 13 Claims

ABSTRACT OF THE DISCLOSURE

Lithographic printing plates are obtained from a laminated element containing a photocurable composition. Said element includes a photocurable layer laminated between a support layer, and a top cover. A dry process is disclosed for preparing positive and negative images in a single-image exposure. The process, for example, includes placing a photocurable layer between two sheets, at least one of which is transparent, imagewise exposing the laminate to actinic or U.V. radiation, and separating the sheets. The imagewise exposure is through a halftone or line positive or negative transparency, or a stencil. Depending upon the system, a positive image attaches to the sheet proximate, the light source, and the negative image to the other sheet, or vice versa. The two sheets have different adhesive forces for photocured and uncured photoadhesive compositions which accounts for the adhesion of the photocured and uncured compositions to different sheets. The sheet containing the photocured composition is, in effect, a lithographic printing plate in that the support surface or the surface of the photocured composition is relatively oleophilic. The photocurable polymer contains at least a polyene, a polythiol, and a photocuring rate accelerator.

BACKGROUND OF THE INVENTION

(1) The prior art

In lithographic printing, the printing surface itself does not have any appreciable relief depth or depression. The general principle upon which lithographic printing is based involves the making a printing image, which is relatively ink receptive (or oleophilic), on a background surface which is comparatively water receptive (or hydrophilic). In general, lithography involves moistening of the non-image areas of the plate with water or a fountain solution which is normally water-containing, to block the ink from the nonimage areas, inking the image areas by some convenient means, such as, rollers, and then transferring the ink to a receiving surface, such as, paper. The ink transfer is usually done by means of the application of pressure to the image-bearing lithographic plate. The two most common means of lithographic printing are direct rotary and offset rotary lithography. Within the scope of this invention, the term lithography will be used in a sense which is broader than that normally used in the lithographic printing arts. Therefore, lithography is defined within the scope of this invention as printing from a printing surface which does not have any appreciable relief depth (about 4 mils or less), wherein, the relatively oleophilic surface is the relief height surface or the relief depth surface, and the other of those two surfaces is relatively hydrophilic. Relief height surface is defined as that surface which is on the peak areas of the relief and the relief depth surfaces are those surfaces which are located in the recesses of the relief-containing layer.

The use of the photographic reproduction technique to produce a lithographic printing plate is old in the art. Those methods include the use of coated paper wherein the coating is sensitive to light and it also involves placing light-sensitive compositions on metal supports. U.S. Patent No. 3,210,187, issued Oct. 5, 1965, discloses a method for preparing a lithographic printing plate from a photopolymerizable element which is essentially composed of a photopolymerizable layer and a support layer, whereby said photopolymerizable layer is exposed to actinic light to form a polymer image. The unexposed and unpolymerizable areas of the photopolymerizable layer are removed to yield the photopolymerized relief image. The underlying support layer is relatively hydrophilic in relation to the oleophilic photopolymerized relief image, thus forming a lithographic printing plate.

(2) Objectives of the invention

It is an object of this invention to provide a new and improved lithographic surface. Another object is to provide a lithographic surface that is easy to make and has a long image life A further object is to provide a lithographic surface that has an image which is easily produced by photocuring a photocurable composition as an outer photocurable layer. An even further object of this invention is to prepare a lithgraphic printing plate which requires no chemical development or etching before its use. An even further object is to produce a lithographic printing plate from photocurable compositions which are liquid in nature. Still further objects will be apparent from the following description of this invention.

BROAD DESCRIPTION OF THE INVENTION

The invention broadly involves a process for preparing a lithographic printing plate which contains a relief image upon a support layer. The lithographic printing plate is prepared from a photocurable element which includes a support layer, a layer containing a photocurable composition and a cover layer The process itself involves imagewise exposing the layer containing the photocurable composition to actinic or U.V. radiation, whereby the exposed areas of the photocurable layer are hardened to an insoluble state, and then separating the cover layer and the support layer. The photocurable polymer composition which has not been exposed to said radiation adheres to either the support layer or the cover layer. The separation usually takes the form of mechanically peeling apart the cover layer and support layer. In the case where the uncured portion adheres to the cover layer, removal of the unexposed photocurable composition uncovers portions of the surface of the support layer, which are oleophilic or hydrophilic in relation to said photocured portions of the photocurable composition (relief images) still adhering to the support layer. When that is the case, preferably, the exposed surfaces of the support layer are relatively hydrophilic and the photocured relief images are relatively oleophilic. The resultant lithographic printing plate can be placed upon a lithographic press and used to print a substantial number of copies. During said printing process the hydrophilic surfaces are wetted with water or a fountain solution and the oleophilic surfaces are inked with a suitable ink, such as, the standard lithographic inks. The support layer can be transparent, and the imagewise exposure can be directed through said transparent support layer (but can be directed from the opposite side).

The support layer and/or cover layer (also termed top layer) can be transparent, and the imagewise exposure can be directed through either layer, if that layer is transparent.

Either the photocured or uncured photocurable composition adheres to the top cover and is removed therewith during the separation step. If the uncured portion remains on the support layer then to make a lithographic plate out of it, the support plate containing the uncured photocurable composition must be exposed (not imagewise) again to ultraviolet radiation. In such a case, the top cover layer is already a lithographic printing plate. If the photocured portion of the photocurable composition remains on the support layer, then the cover layer must be exposed (not imagewise) again to produce a lithographic printing plate. In either case, the top layer containing the photocurable composition, photocured or uncured, can be made into or is a lithographic plate in and of itself. This method of peeling off the top layer containing photocured or uncured photocurable polymer composition eliminates the step of washing out or similarly removing the uncured photocurable polymer composition from the support layer.

This invention includes a lithographic printing plate wherein a photocured relief image is contained on a layer, which is normally termed the support layer, and said surface of the relief image is oleophilic or hydrophilic in relation to the exposed support layer surfaces in the recesses. Preferably, the relief image surfaces are relatively oleophilic and the underlying exposed surfaces of the support layer are relatively hydrophilic, which allows ink to be printed from the relief image itself.

The lithographic printing plates of this invention utilize a photocurable layer which is about 4 mils, or less, in thickness.

DETAILED DESCRIPTION OF THE INVENTION

In lithographic printing, one surface, normally the relief surface, is oleophilic and by implication is water repellent. The other surface, the recessed surface, is hydrophilic and by implication is ink repellent. These properties are relative in the sense that one surface, in relation to another surface, is relatively water repellent or relatively ink repellent or, if you like, relatively, oleophilic or hydrophilic. In short, this means there is no exact scale upon which to base saying one surface is oleophilic and one is surface hydrophilic. An actual inking run must be made on many surfaces to see if they are reltaively oleophilic or hydrophilic. Generally, the photocured compositions of this invention are oleophilic in relation to the support layers, such as, aluminum, paper or surface-treated "Mylar" (a stabilized polyethylene terephthalate resin film). The support layer can be made more hydrophilic or ink repellent by treatment of the surface or a matting or substrate placed thereon and the photocurable relief surfaces can be made more ink receptive or oleophilic by such means as incorporation of other constituents into the photocurable composition or by copolymerizing certain ingredients with the photocurable basic polymer. Even further, the photocured relief areas themselves can be made relatively hydrophilic by the incorporation therein of other polymers or by copolymerizing, etc., or in relation thereto and in place of or in addition to, the surface of support layer itself may be relatively oleohilic to the relief image thereby making the relief image itself relatively hydrophilic in relation to the support. This same effect may be obtained by incorporating certain mattes or substrates on, or treating the surface of the support layer. These latter methods allow a printing technique wherein the ink is printed from the image recesses instead of the image heights.

The crucial ingredients in the photocurable polymer composition are:

(1) 2 to 98 parts by weight of an ethylenically unsaturated polyene containing two or more reactive unsaturated carbon to carbon bonds;
(2) 98 to 2 parts by weight of a polythiol; and
(3) 0.0005 to 50 parts by weight of a photocuring rate accelerator based upon 100 parts by weight of (1) and (2) above. (Preferred range of accelerator is about 0.05 to about 30 parts by weight.)

The reactive carbon to carbon bonds of the polyenes are preferably located terminally, near terminally, and/or pendant from the main chain. The polythiols, preferably, contain two or more thiol groups per molecule. These photocurable compositions are usually, and preferably, liquid at room temperatures, although the compositions can be solid, crystalline, semisolid, etc., at those temperatures, but which are liquid at 70° C.

Included in the term "liquid," as used herein, are those photocurable compositions which in the presence of inert solvent, aqueous dispersion or plasticizer have a viscosity ranging from essentially zero to about 20 million centipoises at 70° C.

As used herein polyenes and polyynes refer to simple or complex species of alkenes or alkynes having a multiplicity, i.e., at least 2, "reactive" carbon to carbon unsaturated functional groups per average molecule. For example, a diene is a polyene that has two "reactive" carbon to carbon double bonds per average molecule, while a diyne is a polyyne that contains in its structure two "reactive" carbon to carbon triple bonds per average molecule. Combinations of "reactive" double bonds and "reactive" triple bonds within the same molecule are also operable. An example of this is monovinylacetylene, which is a polyeneyne under our definition. For purposes of brevity all these classes of compounds will be referred to herein as polyenes.

As used herein the term "reactive" unsaturated carbon to carbon groups means groups which will react under proper conditions as set forth herein with thiol groups to yield the thioether linkage $$(\overset{|}{\underset{|}{C}}-S-\overset{|}{\underset{|}{C}}-)$$

as contrasted to the term "unreactive' carbon to carbon unsaturation which means $$-\overset{|}{C}=\overset{|}{C}-$$

groups when found in aromatic nucleii (cyclic structures exemplified by benzene, pyridine, anthracene, tropolone and the like) which do not under the same conditions react with thiols to give thioether linkages. In the instant invention products from the reaction of polyenes with polythiols which contain 2 or more thiol groups per average molecule are called polythioether polymers or polythioethers.

Methods of preparing various polyenes useful within the scope of this invention are disclosed in copending application have Ser. No. 674,773, filed Oct. 12, 1967, now abandoned, and assigned to the same assignee. Some of the useful polyenes are prepared in the detailed examples, set forth in the following specification.

One group of polyenes operable in the instant invention is that taught in a copending application having Ser. No. 617,801, inventors: Kehr and Wszolek, filed: Feb. 23, 1967, and assigned to the same assignee. This group includes those having a molecular weight in the range of 50 to 20,000, a viscosity ranging from 0 to 20 million centipoises at 70° C. of the general formula:

$$[A]\!-\!(X)_m$$

wherein X is a member of the group consisting of $$R-\overset{R}{\overset{|}{C}}=\overset{R}{\overset{|}{C}}-$$

and R—C≡C; $m$ is at least 2; R is independently selected from the group consisting of hydrogen, halogen, aryl, subsituted aryl, cycloalkyl, substituted cycloalkyl, aralkyl, substituted aralkyl and alkyl and substituted alkyl groups containing 1 to 16 carbon atoms and A is a polyvalent organic moiety free of (1) reactive carbon to carbon unsaturation and (2) unsaturated groups in conjugation with the reactive ene or yne groups in X. Thus A may contain cyclic groupings and minor amounts of hetero atoms such as N, S, P or O but contains primarily carbon-carbon, carbon-oxygen or silicon-oxygen containing chain linkages without any reactive carbon to carbon unsaturation.

In this first group, the polyenes are simple or complex species of alkenes or alkyenes having a multiplicity of pendant, terminally or near terminally positioned "reactive" carbon to carbon unsaturated functional groups per average molecule. As used herein for determining the position of the reactive functional carbon to carbon unsaturation, the term "terminal" means that said functional unsaturation is at an end of the main chain in the molecule; whereas by "near terminal" is meant that the functional unsaturation is not more than 16 carbon atoms away from an end of the main chain in the molecule. The term "pendant" means that the reactive carbon to carbon unsaturation is located terminally or near terminally in a branch of the main chain as contrasted to a position at or near the ends of the main chain. For purposes of brevity all of these positions will be referred to generally as "terminal" unsaturation.

The liquid polyenes operable in this first group contain one or more of the following types of non-aromatic and non-conjugated "reactive" carbon to carbon unsaturation:

| | | | |
|---|---|---|---|
| (1) | —CH=CH— | (5) | $-\overset{\vert}{C}=\overset{\vert}{C}-$ |
| (2) | —C≡C— | (6) | $-\overset{\vert}{C}=CH-$ |
| (3) | $-CH=CH_2$ | (7) | $-CH=\overset{\vert}{C}-$ |
| (4) | —C≡CH | (8) | $-\underset{\vert}{C}=CH_2$ |

These functional groups as shown in 1–8 supra are situated in a position either which is pendant, terminal or near terminal with respect to the main chain but are free of terminal conjugation. As used herein the phrase "free of terminal conjugation" means that the terminal "reactive" unsaturated groupings may not be linked directly to non-reactive unsaturated species such as

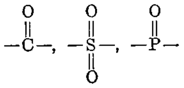

and the like so as to form a conjugated system of unsaturated bonds exemplified by the following structure:

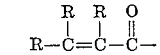

etc. On the average the polyenes must contain 2 or more "reactive" unsaturated carbon to carbon bonds/molecule and have a viscosity in the range from slightly above 0 to about 20 million centipoises at 70° C. Included in the term "polyenes" as used herein are those materials which in the presence of an inert solvent, aqueous dispersion or plasticizer fall within the viscosity range set out above at 70° C. Operable polyenes in the instant invention have molecular weights in the range of about 50 to about 20,000, preferably about 500 to about 10,000.

Examples of operable polyenes from this first group include, but are not limited to:

(1) Crotyl-terminated polyurethanes which contain two "reactive" double bonds per average molecule in a near terminal position of the average general formula:

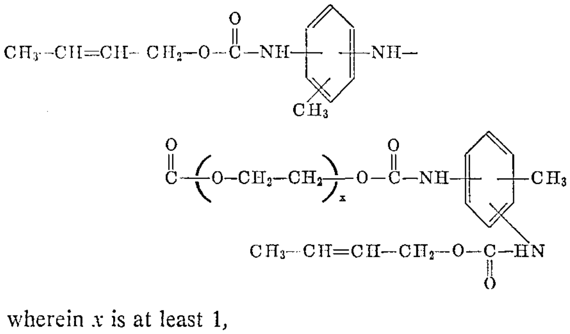

wherein $x$ is at least 1, (2) Ethylene/propylene/non-conjugated diene terpolymers, such as "Nordel 1040" manufactured by E. I. du Pont de Nemours & Co., Inc., which contains pendant "reactive" double bonds of the formula:

$$-CH_2-CH=CH-CH_3$$

(3) The following structure which contains terminal "reactive" double bonds:

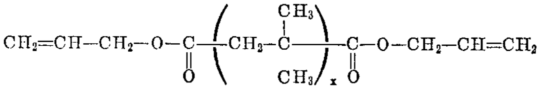

where $x$ is at least 1.

(4) The following structure which contains near terminal "reactive" double bonds

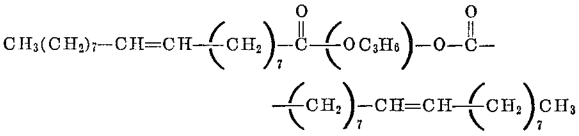

where $x$ is at least 1.

Another (or second) group of operable polyenes includes those unsaturated polymers in which the double or triple bonds occur primarily within the main chain of the molecules. Examples include conventional elastomers (derived primarily from standard diene monomers) such as polyisoprene, polybutadiene, styrene-butadiene rubber, isobutylene-isoprene rubber, polychloroprene, styrene-butadiene-acrylonitrile rubber and the like; unsaturated polyesters, polyamides, and polyurethanes derived from monomers containing "reactive" unsaturation, e.g., adipic acid-butenediol, 1,6-hexanediamine fumaric acid and 2,4-tolylene diisocyanate-butenediol condensation polymers and the like.

A third group of polyenes operable in this invention includes those polyenes in which the reactive unsaturated carbon to carbon bonds are conjugated with adjacent unsaturated groupings. Examples of operable conjugated reactive ene systems include but are not limited to the following:

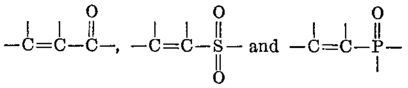

A few typical examples of polymeric polyenes which contain conjugated reactive double bond groupings such as those described above are poly (oxyethylene) glycol (600 M.W.) diacrylate, poly (oxytetramethylene) glycol (1000 M.W.) dimethylacrylate, the triacrylate of the reaction product of trimethylol propane with 20 moles of ethylene oxide, and the like.

As used herein, the term polythiols refers to simple or complex organic compounds having a multiplicity of pendant or terminally positioned —SH functional groups per average molecule.

On the average the polythiols must contain 2 or more —SH groups/molecule. They usually have a viscosity range of slightly above 0 to about 20 million centipoises (cps.) at 70° C., as measured by a Brookfield viscometer. Included in the term "polythiols" as used herein are those materials which in the presence of an inert solvent, aqueous dispersion or plasticizer fall within the viscosity range set out above at 70 C. Operable polythiols in the instant invention usually have molecular weights in the range about 50 to about 20,000, preferably about 100 to about 10,000.

The polythiols operable in the instant invention can be exemplified by the general formula: $R_8-(SH)_n$ where $n$ is at least 2 and $R_8$ is a polyvalent organic moiety free from "reactive" carbon to carbon unsaturation. Thus $R_8$ may contain cyclic groupings and minor amounts of hetero atoms such as N, S, P or O but primarily contains carbon-hydrogen, carbon-oxygen, or silicon-oxygen containing chain linkages free of any "reactive" carbon to carbon unsaturation.

One class of polythiols operable with polyenes in the instant invention to obtain essentially odorless cured polythioether printing plates are esters of thiol-containing acids of the general formula: HS—$R_9$—COOH where $R_9$ is an organic moiety containing no "reactive" carbon to carbon unsaturation with polyhydroxy compounds of the general structure: $R_{10}$—$(OH)_n$ where $R_{10}$ is an organic moiety containing no "reactive" carbon to carbon unsaturation and *n* is 2 or greater. These components will react under suitable conditions to give a polythiol having the general structure:

$$R_{10}\left(-O\overset{\overset{\displaystyle O}{\|}}{C}-R_9-SH\right)_n$$

where $R_9$ and $R_{10}$ are organic moieties containing no "reactive" carbon to carbon unsaturation and *n* is 2 or greater.

Certain polythiols such as the aliphatic monomeric polythiols (ethane dithiol, hexamethylene dithiol, decamethylene dithiol, tolylene-2,4-dithiol, etc.) and some polymeric polythiols such as a thiol-terminated ethylcyclohexyl dimercaptan polymer, etc. and similar polythiols which are conveniently and ordinarily synthesized on a commercial basis, although having obnoxious odors, are operable in this invention. Examples of the polythiol compounds preferred for this invention because of their relatively low odor level and fast curing rate include but are not limited to esters of thioglycolic acid ($HS—CH_2COOH$), α-mercaptopropionic acid $$(HS—CH(CH_3)—COOH)$$

and β-mercaptopropionic acid ($HS—CH_2CH_2COOH$) with polyhydroxy compounds such as glycols, triols, tetraols, pentaols, hexaols, etc. Specific examples of the preferred polythiols include but are not limited to ethylene glycol bis(thioglycolate), ethylene glycol bis(β-mercaptopropionate), trimethylolpropane tris(thioglycolate), trimethylolpropane tris(β-mercaptopropionate), pentaerythritol tetrakis (β-mercaptopropionate), all of which are commercially available. A specific example of a preferred polymeric polythiol is polypropylene ether glycol bis(β-mercaptopropionate) which is prepared from polypropylene-ether glycol (e.g. Pluracol P2010, Wyandotte Chemical Corp.) and β-mercaptopropionic acid by esterification.

The preferred polythiol compounds are characterized by a low level of mercaptan-like odor initially, and after reaction, give essentially odorless cured polythioether end products which are commercially useful resins or elastomers for printing plates.

As used herein the term "odorless" means the substantial absence of the well-known offensive and sometimes obnoxious odors that are characteristic of hydrogen sulfide and the derivative family of compounds known as mercaptans.

The term "functionality" as used herein refers to the average number of ene or thiol groups per molecule in the polyene or polythiol, respectively. For example, a triene is a polyene with an average of three "reactive" carbon to carbon unsaturated groups per molecule and thus has a functionality (*f*) of three. A polymeric dithiol is a polythiol with an average of two thiol groups per mloecule and thus has a functionality (*f*) of two.

It is further understood and implied in the above definitions that is these systems, the functionality of the polyene and the polythiol component is commonly expressed in whole numbers although in practice the actual functionality may be fractional. For example, a polyene component having a nominal functionality of 2 (from theoretical considerations alone) may in fact have an effective functionality of somewhat less than 2. In an attempted synthesis of a diene from a glycol in which the reaction proceeds to 100% of the theoretical value for complete reaction, the functionality (assuming 100% pure starting materials) would be 2.0. If, however, the reaction were carried to only 95% of theory for complete reaction, about 10% of the molecules present would have only one ene functional group, and there may be a trace of material that would have no ene functional groups at all. Approximately 90% of the molecules, however, would have the desired diene structure and the product as a whole then would have an actual functionality of 1.9. Such a product is useful in the instant invention and is referred to herein as having a functionality of 2.

The aforesaid polyenes and polythiols can, if desired, be formed or generated in situ and still fall within the scope of the instant invention.

To obtain the maximum strength, solvent resistance, creep resistance, heat resistance and freedom from tackiness, the reaction components consisting of the polyenes and polythiols of this invention generally are formulated in such a manner as to give solid, crosslinked, three dimensional network polythioether polymer systems on curing. In order to achieve such infinite network formation the individual polyenes and polythiols must each have a functionality of at least 2 and the sum of the functionalities of the polyene and polythiol components must always be greater than 4. Blends and mixtures of the polyenes and the polythiols containing said functionality are also operable herein.

In general, it is preferred, especially at or near the operable lower limits of functionality in the polyene and polythiol, to use the polythiol and the polyene compounds in such amounts that there is one thiol group present for each double bond, it being understood that the total functionality of the system must be greater than four, and the functionality of the thiol and the diene must each be at least two. For example, if two moles of a triene are used, and a dithiol is used as the curing agent, making the total functionality have a value of five, it is preferable to use three moles of the dithiol. If much less than this amount of the thiol is used, the curing rate will be lower and the product will be weaker because of the reduced crosslink density. If much more than the stoichiometric amount of the thiol is used, the rate of cure may be higher, if that is desirable, although excessive amounts can lead to a plasticized crosslinked product which may not have the desired properties. However, it is within the scope of this invention to adjust the relative amounts of polyenes and polythiols to any values above the minimum scope disclosed herein which give desirable properties to the crosslinked polythioether.

The photocurable element should be exposed to actinic radiation containing a substantial amount of ultraviolet radiation until substantial photocuring takes place in the exposed areas.

The photocuring reaction can be initiated by U.V. radiation contained in actinic radiation from sunlight or obtained from special light sources which emit significant amounts of U.V. light. Thus it is possible merely to expose the polyene and polythiol admixture to actinic radiation under ambient conditions or otherwise and obtain a cured solid elastomeric or resinous product useful as image reproducting or printing plate materials. But this approach to the problem results in long exposure times which cause the process in vest bulk of applications to be commercially unfeasible. Chemical protocuring rate accelerators, i.e., photoinitiators or sensitizers, or activators, serve to drastically reduce the image exposure time and thereby when used in conjunction with various forms of energetic radiation (containing U.V. radiation) yield very rapid, commercially practical photocures by the practice of the instant invention. Examples of useful chemical photocuring rate accelerators are such as benzophenone, acetophenone, acenapthene-quionone, methyl ethyl ketone, Thioxanthen-9-one, 7-H-Benz [de]

anthracen-7-one, dibenzosuberone, 1 - naphthaldehyde, 4,4-bis (dimethylamino) benzophenone, fluorene-9-one, 1'-acetonaphthone, 2'-acetonaphthone, 2,3-butanedione, anthraquinone, 1-indanone, 2-tert-butyl anthraquinone, valerophenone, hexanophenone, 8-phenylbutyrophenone, p - morpholinopropiophenone, 4 - morpholinobenzophenone, 4'morpholinodeoxybenzoin, p-diacetylbenzene, 4-aminobenzophenone, 4-methoxyacetophenone, benzaldehyde, α-tetralone, 9-acetylphenanthrene, 2-acetylphenanthrene, 10-thioxanthenone, 3-acetylphenanthrene, 3-acetylindole, 1,3,5-triacetylbenzene, etc. and the blends thereof. The photoinitiators (the third crucial ingredient) are added in an amount ranging from about 0.0005 to about 10 percent or more by weight of the polyene and polythiol components in the instant invention. Useful U.V. radiation has a wave length in the range of about 2000 to about 4000 angstrom units.

The photocurable composition is characterized in that in its cured state at room temperature, or above, it has greater adhesion for one support than the other and in its uncured state, it has greater adhesion for the other layer than for the first. The photocurable stratum is further characterized in that it is normally and preferably a viscous liquid or thixotropic paste or a weak wax-like semisolid at room temperatures in its uncured state; and it is a tough, high molecular weight solid at all normally encountered temperatures in its cured state. The remainder of the discussion of adhesion in this paragraph is concerned with the step separating the support layer and cover layer. If $A_1$ and $A_2$ represent the adhesive strengths of the uncured stratum to supports 1 and 2 and $A'_1$ and $A'_2$ represent the adhesive strengths of the stratum in the photo-cured state then the conditions suitable for producing clear, sharp negative images by peeling apart the image-wise exposed laminated element may be expressed as follows, $$A_1 < A_2 \text{ and } A'_1 > A'_2$$

The value of the cohesive strength of the photocurable composition, both exposed and unexposed, must be greater than $A_1$, $A_2$, $A'_1$ and $A'_2$. The test for the various forces merely involves measuring at room temperature the load necessary to peel apart one inch wide strips of the laminated elements, both exposed to actinic radiation and unexposed. By room temperature, as used herein, it is intended that a range of temperatures from 10° C. to 40° C. shall be included.

Materials to serve as coating and as laminating supports may include a wide variety of synthetic polymeric sheets; fibrous sheets, such as, papers of opaque and semi-opaque variety, that is, glassing and papers used in the printing trades; glass; and metal sheets, such as stainless steel, aluminum, etc. As two layers (support and cover) are used, one on each side of the photopolymerizable composition layer, at least one of the layers must be transparent to the exposure radiation. Also as two layers are used with the photocurable layer sandwiched in between them, the adhesive forces at room temperature between the layers and the photocurable stratum must be uniform and satisfy the values set forth above and the cohesive strength of the photocurable composition must be greater than any adhesive force.

The coating of photocurable composition can be rather thick but the image quality is not as good as desired in lithographic printing. Therefore, the maximum coating thickness is about 0.004 inch; the minimum coating thickness about 0.0001 inch; and the preferred range is about 0.0003 to 0.0006 inch.

The compositions to be photocured, i.e., converted to solid lithographic printing plates, in accord with the present invention may, if desired, include such additives as natural or synthetic resins, antioxidants, dyes, inhibitors, activators, fillers, pigments, antistatic agents, flame-retardant agents, thickeners, thixotropic agents, surface-active agents, light scattering agents, viscosity modifiers, extending oils, plasticizers, tackifiers and the like within the scope of this invention. Such additives are usually preblended with the polyene or polythiol prior to or during the compounding step. As is the case with any material which is added to the photocurable polymer composition useful within the scope of this invention, one should take care that it does not affect the oleophilic or hydrophilic characteristics thereof in a manner which is undesired. Operable fillers include natural and synthetic resins, carbon black, glass fibers, wood flour, clay, alumina, carbonates, e.g.; a, oxides, e.g., titanium dioxide, hydroxides, silicates, glass flakes, glass beads, borates, phosphates, diatomaceous earth, calcium sulfate, a calcium carbonate, antimony oxide, colloidal carbon, titanium dioxide, various colored pigments, various organophilic silicas, powdered glass, and the like. The aforesaid additives may be present in quantities up to 500 parts or more per 100 parts photocurable polymer composition by weight and preferably 0.005 to 300 parts on the same basis.

The type and concentration of additives must be selected with great care so that the final composition remains photocurable under practical conditions of exposure and with commercially feasible time cycles maintained throughout the operation. Additives which block out the passage of U.V. light or which detract from the stability of the photocurable composition must be avoided. To make the normally oleophilic photocured image relief hydrophilic, a hydrophilic filler can be incorporated therein. The hydrophilic filler can be selected from such things as finely divided clay, e.g., kaolin, chalk, talc, silica, silica gel, palladium pentaoxide, pentaoxide, barium sulfate, magnesium, trisilicate, and the like. Silica gel is the preferred hydrophilic filler as its use produces an image-printing surface which has good wearing properties. The other hydrophilic fillers are satisfactory but do not wear as well without aging. The best results with fillers are those which are finely divided, that is, having a particle size preferably in the range of 3 to 9 microns, although the filler particle size can range from about 0.01 to 12 microns or more with the result that good images are obtained.

The compounding of the components prior to photocuring can be carried out in several ways. One useful method of compounding is prepared by conventional mixing techniques (but in absence of actinic radiation) a composition consisting of a polyene, a polythiol, a U.N. photoinitiator, an antioxidant and other inert additives. This composition generally can be stored in the dark for extended periods of time. Such a composition can be charged to an erosol can, drum, tube, or cartridge for subsequent use.

In certain instances, for example, where the polyene is of an extremely high molecular weight, it may be desirable to use a solvent to compound the photocurable composition so that it may be readily compounded and spread upon a support layer. One can use a solvent suitable for such purposes. A suitable solvent is, for example, "Cellosolve" acetate i.e., ethylene glycol monoethylether acetate commercially available from Union Carbide Corporation.

Conventional curing inhibitors or retarders operable in the instant invention include but are not limited to hydroquinone; P-tert-butyl catechol; 2,6 - ditert-butyl-p-methylphenol; phenothiazine and N-phenyl-2 - napthylamine. The majority of the commercially available monomers and polymers used in the photocurable compositions normally contain minor amounts (about 50 to 5000 parts per million by weight) of inhibitors to prevent spontaneous polymerization prior to use in making a printing plate. The presence of these inhibitors in optimum amounts causes no undesirable results in the photocurable layer of this invention.

The molecular weight of the polyenes of the instant invention can be measured by various conventional methods including solution viscosity, osmotic pressure and gel permeation chromatography. Additionally, the molecular weight can be sometimes calculated from the known molecular weight of the reactants. The viscosity of the polyenes and polythiols was measured on a Brookfield Viscometer at 30 or 70° C. in accord with the instructions therefor.

The photocurable composition can vary from a liquid to a solid state, including a gel or elastomeric state. The photocurable composition may also contain a thickening agent to increase the viscosity of the photocurable liquid polymer. For example, cellulosic derivatives, finely divided silicas and finely ground fibrous asbestos materials may be used. The preferred photocurable compositions of the instant invention have viscosities in the range of about 0.25 to about 350 poises and above and preferably from about 5 to about 150 poises at or below 70° C.

The supporting base material, that is, the support employed, can be a natural or synthetic property capable of existence in film sheet or plate form and which is rigid although flexible to a certain extent when desired to be used as a suitable support in a rotary lithographic printing procedure. In speaking at this point of the support, this discussion does not include what has been termed as the top layer or top cover. The support can also be reflective or nonreflective of actinic light. Broadly, the support can be rubber, plastic, metal, paper, or glass. Plastics are preferably employed as a support. Suitable metals for a support include, but are not limited to steel, aluminum, magnesium and the like. Additionally, the support layer can be a photocurable composition per se. That is, a portion of a photocurable composition can be poured into a mold and exposed directly to actinic light to solidify the entire layer of the photocurable composition. After solidification, this layer will serve as a support for an additional amount of photocurable composition poured on top of the support, which additional amount would form the relief after exposure through an image-bearing transparency to actinic light.

As a support on which the photocurable composition is coated, there may be mentioned several types of substantially transparent films. Films composed of high polymers, e.g., polystyrene, polyamides, polyolefins, polyesters, vinyl polymers and cellulosics are quite suitable and in order for the above adhesive relationships to obtain these films may or may not contain an auxiliary layer to control anchorage. Specifically, the support can be composed of various film-forming plastics such as addition polymers, vinylidene polymers, e.g., vinyl chloride, vinylidene chloride copolymers with vinyl chloride, vinyl acetate, styrene, isobutylene and acrylonitrile; and vinylchloride copolymers with the latter polymerizable monomers; the linear condensation polymers such as the polyesters, e.g., polyethylene terephthalate; the polyamides, e.g., polyhexamethylene sebacamide; polyester amides, e.g., polyhexamethyleneadipamide/adipate, and the like. Fillers or other reinforcing agents can be present in the synthetic resin or polymer support such as various fibers (synthetic, modified, or natural), e.g., cellulosic fibers, for instance, cotton, celluslose acetate, viscose rayon, paper; glass wool; nylon and the like. These reinforced bases may be used in laminated form.

When the support is highly reflective, e.g., aluminum, oblique rays of actinic light passing through the image bearing transparency and photocurable composition reflect off the support at such an angle as to cause curing in nonimage areas. To avoid this, a light absorptive layer is employed between the reflective support and the photocurable composition.

The light absorptive layer intermediate between the light-reflective support and the photocurable composition can be made from various materials. Suitable materials of this type are dyes and pigments. Useful inorganic pigments for a light absorptive layer include iron oxide in various forms, e.g., Indian red, Venetian red, ocher, umber, sienna, iron black and the like; lead chromate, lead molybdate (chrome yellow and molybdenum orange); cadmium yellow, cadmium red, chromium green, iron blue, manganese black, various carbon blacks such as lamp black, furnace black, channel black and the like. Organic dyes soluble in the vehicles normally used in applying the light absorptive layer are best added as pigments in the form of lakes prepared by precipitating an insoluble salt of the dye on an inert, inorganic substrate. A list of such lakes and similar organic pigments is shown in "Printing and Litho Inks," J. H. Wolfe, pages 124–173, Fourth Edition, MacNair-Dorland and Co., New York (1949).

If a light-absorptive layer is employed as taught above, it must have adequate adhesion to the support and photocured layer. Said adhesion is usually supplied by suitable polymeric or resin carriers which includes, but are not limited to, vinyl halides, e.g., polyvinyl chloride; vinyl copolymers particularly of vinyl halides, e.g., vinyl chloride with vinyl acetate, diethyl fumarate, ethyl acrylate, allyl glycidyl ether, glycidyl methacrylate; vinyl chloride/vinyl acetate/maleic anhydride copolymer; polyvinyl butyral; monomeric dimethylacrylate esters of the polyethylene glycols in combination with vinyl chloride copolymers; and styrene or diallyl phthalate with polyesters such as diethylene glycol maleate, diethylene glycol maleate/phthalate, triethylene glycol fumarate/sebacate, and the like.

Suitable materials employed as a light absorptive material used with a reflective support are dyes and pigments. Pigments are preferred primarily because they do not bleed into the photocurable layer. In any event these materials must be unreactive with the photocurable layer. These light absorptive materials are preferably applied to the support in suspension in a polymer or resin capable of adhering to the support and the photocurable composition.

After the photocurable composition is coated upon the support layer, a second film (termed the "top cover") is laminated upon the surface of the photocurable layer. In certain embodiments of this invention, this top cover has an $A_2$ greater than $A_1$ for unexposed photocurable material at room temperature. The top cover may have a matte surface as a separate layer or it may be an integral part of the film. This matte or anchoring characteristic serves to assure that $A_2$ is greater than $A_1$. Preferably, the top surface when used is laminated to the surface of the photocurable element layer at temperatures ranging from about 20° to 150° C. and at pressures ranging from about 40 p.s.i. upwards. Films or sheets suitable for the laminated top cover may be taken from any of the above transparent polymeric films, in which case, the surface to be laminated to the surface of photocurable stratum is modified so that the adhesion ($A_2$) of the unpolymerized stratum is greater than the adhesion ($A_1$) to the substantially transparent film support. Specific high polymer films include: polyolefins; polyamides, i.e. polyhexamethylene sebacamide, polyhexamethylene adipamide; polyethylene, polypropylene, polyesters, i.e., polyethylene terephthalate, polyethylene terephthalate/isophthalate copolymers; vinyl acetals; vinylidene chloride copolymerized with vinyl chloride, styrene and acrylonitrile, cellulose acetate cellulose acetate/butyrate, viscose rayon, etc. Other laminating supports include translucent drafting films described in U.S. Pat. No. 2,964,423, dated Dec. 13, 1960, and U.S. Pat. No. 3,115,420, dated Dec. 24, 1963. The above patents comprise a polyester support having thereon a layer containing a particulate material. In the above patents, the layer comprises a urea-formaldehyde resin having dispersed therein a solid inorganic toothing agent having an average particles size from 0.1 to 10 microns. Suitable supports may also be used wherein the particulate material is dispersed throughout the film rather than in a surface coating. The film supports of U.S. Pat. No. 2,627,088 are also suitable. The films disclosed and claimed therein comprise a polyester film having on the surface thereof as an anchoring layer, a copolymer containing at least 35% vinylidene chloride, the remainder comprising an acrylic acid ester and itaconic acid. Other surface treatments which will provide the laminating supports with the required adhesion characteristics comprise flame treating, treatment with electrostatic discharge, and also treating with chromic acid.

In addition, the top cover may also be glass or semi-transparent paper. It is not important that the top cover be particularly rigid unless such top cover is also going to be used as the support for a lithographic printing plate itself.

The support layer can be transparent, so that the exposure to the negative can be through said support layer, in which case if the support layer contains a matte layer or subbing, such matte layer on subbing should be essentially transparent. The term "essentially transparent" as used within the scope of this invention and in all cases includes the terms "transparent" and "translucent."

It is important to select the correct exposure time in the photocuring process of this invention. That is, in making lithographic printing plates, it is esesntial that the exposure be sufficent to harden the photocurable composition in the exposed image areas without causing significant curing in the non-image areas. Aside from exposure time and light intensity, the extent of the exposure is dependent on the thickness of the photocurable layer, the curing temperature, the structure and functionality of the polyene and polythiol employed, the photoinitiator type and concentration, the photocuring rate, the presence of light absorbing pigments or dyes in the photocurable composition, and the character of the image to be produced. In general, the thicker the layer to be photocured, the longer the exposure time. It has been observed that photocuring starts at the surface of the photocurable layer closest to the light source and proceeds downward to the support. With insufficient exposure, the layer may have a hard photocure at the surface but, through lack of a clear-through photocure, the relief will be removed when the unexposed area is removed. Inasmuch as the photocuring rate usually increases at higher temperatures, less exposure is required thereat than at room temperature. Thus ultraviolet light sources that emit heat or the concurrent use of an infrared lamp with the U.V. lamp, etc., are more efficient than cold ultraviolet light sources. However, care must be exercised that too high a temperature is not attained during the photocure, as this leads to, in some cases, thermal expansion of the photocurable composition which results in image distortion. Hence, it is prefered that the photocuring be carried out at a temperature in the range of about 20° to about 70° C. Due to the number of variables which affect exposure time, optimum results are best determined by trial and error, e.g., stepped exposures with characterization after each exposure.

Photocured images can also be prepared by the instant invention by projection through a suitable lens system.

When using a broad light source such that oblique rays are emitted, even a thin top cover between the surface of the transparency and the photocurable layer causes some broadening of the image. Ordinarily this has very little effect except in the preparation of half-tone or line plates with fine lines. Such plates are best prepared with the negatives directly in contact with the outer surface of the top cover, except for a thin layer of a parting agent such as silicone oil. For this reason, a point or collimated light source is preferred. In this latter case, an air gap can be employed if desired, between the outer surface of the top cover and the surface of the image bearing transparency, stencil, etc.

A suitable apparatus for exposure of the photocurable element is given in a copending application having Ser. No. 674,773, inventors: Werber, Wszolek and Kehr, filed: Oct. 12, 1967, and assigned to the same assignee.

Various light sources can be used to obtain sufficient U.V. light to practice the instant invention. Such sources include carbon arcs, mercury arcs, fluorescent lamps with special ultraviolet light emitting phosphors, xenon arcs, argon glow lamps, and photographic flood lamps. Of these, the mercury vapor arcs, particularly the sun-lamp type, and the xenon arcs are very useful. The sun-lamp mercury vapor arcs are customarily used at a distance of 7 to 10 inches from the photocurable layer, whereas the xenon arc is placed at a distance of 24 to 40 inches from the photocurable layer. With a more uniform extended source of low intrinsic brilliance, such as a group of contiguous fluorescent lamps with special phosphors, the plate can be exposed within an inch of the lamps.

It is preferred that the light emanate from a point source or in the form of parallel rays but divergent beams are also operable as a source of actinic light in the instant invention. An air gap can be maintained between the photocurable element and the image-bearing transparency. Such an air gap can range in width up to about 250 mils or more.

The element is preferably exposed to actinic radiation through the transparent support having the lower adhesion for the cured polymer on which it is desired to have the cured portion adhere. The exposure may be by means of a light source which is rich in ultraviolet radiation through a half-tone or line-image transparency, e.g., process negative or positive (an image-bearing transparency consisting solely of substantially opaque and substantially transparent areas where the opaque areas are substantially of the same optical density). The time required for exposure will range from a few seconds to several minutes or more depending on the intensity of the exposing radiation and the inherent photocuring rate of the composition. After exposure the top cover layer and support layer are separated preferably by peeling then apart at about room temperature. For the best results, the top cover and support are separated at a moderate speed at about 0.1 to 25 inches per second. In the preferable procedure, the exposed areas of the photocurable stratum adheres to the support layer. The transparent or translucent photocurable composition layer is photocured clear through to the support where exposed to actinic light, whereas the unexposed areas remain in substantially the original state, i.e., no significant photocuring takes place in the areas protected by the opaque image in the image-bearing transparency. If a viscous liquid or photocurable composition is initially used, the uncured portion readily separates from the hardened photocured portion when two outer sheets are used and subsequently pulled apart, or the uncured portion may be readily removed by washing. A high temperature treatment may be needed to remove the uncured portion if a solid photocurable composition is initially used.

A convenient method to carry out the process of this invention is to place image-bearing, line or halftone, negative or positive transparency or sencil parallel to the surface the top cover of the photocurable element. The image-bearing transparency and the surface of or transparent top cover can be in contact or have an air gap therebetween as desired. The photocurable layer is exposed through the transparency to a source of actinic light, preferably a point or collimated light source when a liquid photocurable composition is used, until the photocurable layer is photocured to an insoluble state in the exposed areas. The thickness of the ultimate relief in such a process can be controlled by varying the thickness of the layer of the photocurable composition. If the photocurable composition is a solid under atmospheric conditions, the composition can be precast at elevated temperatures in liquid form to any desired thickness and thereafter solidified. If the photocurable composition is liquid at room temperatures, it can be placed in a frame or a molded bottom support and poured into said mold, etc. and any excess removed with a doctor blade or similar means and thereafter, have a top cover laminated thereon. The thus photocured photocurable plate is then developed by pulling apart the top cover and the support layer.

Prior to photocuring, the photocurable liquid polymer compositions can be formulated to be used as 100 percent solids compounds (i.e., no volatile ingredients), or they can be used in organic solvent solutions at both low and high total solids contents, or they can be used as dispersions or emulsions in aqueous media.

The photocurable liquid polymer compositions of the instant invention prior to photocuring can readily by pumped, poured, siphoned, brushed, sprayed, doctored, rolled, trowelled, dip-coated, extruded or gunned into place into cavities, molds, or onto vertical or horizontal flat surfaces in a uniform fashion.

The liquid polythioether photocurable components and compositions in the instant invention can, prior to photocuring be admixed with or blended with other monomeric and polymeric materials, such as, thermoplastic resins, elastomers, or thermo-setting resin monomers or polymeric compositions. The resultant blend can then be subjected to conditions for photocuring or cophotocuring the various components of the blend to give the cured products the necessary physical properties to make it more oleophilic or relatively hydrophilic as desired.

Before use as a lithographic printing plate, the lithographic printing plate is often wetted with water containing a water soluble colloid, such as, gum arabic, or other water soluble hydrophilic colloids or other surface active agents, to improve the hydrophilic-oleophilic (hydrophilic characteristics of the surface). Once placed upon a lithographic printing press, the printing plate surface is dampened and subsequently inked, and then the printing plate surface is applied against the surface upon which you wish to print or transfer the image to. The wetting material can be water or any useful lithographic fountain solution. The fountain solution used in offset lithographic printing operations normally contains some acid and desensitizing compound so as to keep the nonprinting areas clean during long runs—this prevents the transfer of ink to the hydrophilic surface areas. The pH of the fountain solution can often be as high as 5 to 6. Wetting agents may also be found in conventional fountain solution is carefully controlled quantities.

The useful lithographic inks cover the span of the conventional lithographic inks. In general, a useful lithographic ink is basically a concentrated dispersion of pigment in a viscous oil vehicle, with various additives to give it suitable working properties. These various additives include such things as a dryer to accelerate hardening after printing, or a resin dissolved in a volatile solvent which evaporates upon being printed out.

A general discussion of the background of lithography and the various techniques of lithographic printing, such as, direct and offset lithography or single impressions with reinking and the various types of lithographic inks, inking rollers and offset blankets, etc. are found in Kirk et al., "Encyclopedia of Chemical Technology," volume 11, pages 129–140 (1953).

The following examples will aid in explaining, but should not be deemed as limiting, the instant invention. In all cases, unless otherwise noted, all parts and percentages are by weight.

Example 1

200 grams. of "Niax D–560" poly(epsilon-caprolactane) diol and is commercially available from Union Carbide Co.) were charged to a 500 ml., 3-neck flask. The material was heated (20 minutes) to 110° C. under vacuum and nitrogen maintained at those conditions for one hour, and cooled to about 70° C. 0.1 cc. of dibutyl tin dilaurate was added to the flask. 18 gm. of allyl isocyanate was placed in a dropping funnel and added to the flask at a moderate rate. These additional operations took about 5 minutes, during which time the temperature rose to 80° C. The reaction was continued for one hour (at about 75° C.). The resultant polymer composition was labeled polymer A.

100 parts by weight of polymer A, 12.5 parts by weight "Q–43 Ester," i.e., pentaerythritol tetrakis ($\beta$-mercaptopropionate) commercially available from Carlisle Chemical Co., and 0.5 parts by weight of benzophenone were admixed. 10 parts by weight of xylene were added to the mixture. The resultant composition was labeled photocurable composition A.

Example 2

200 gms. of "Niax D–560" were charged to a 500 ml., 3-neck flask. The material was heated to 110° C. (20 minutes) under vacuum and nitrogen maintained at those conditions for one hour, and cooled to about 70° C. 0.1 cc. of dibutyl tin dilaurate was added to the flask. 9 gms. of "Mondur TD–80" and 9 gms. of allyl isocyanate were placed in a dropping funnel and added to the flask at a moderate rate. These additional operations took about 20 minutes, during which time the temperature rose to about 100° C. The reaction was continued for one hour (at about 75° C.). The resultant polymer composition was labeled polymer B.

100 parts by weight of polymer B, 6 parts by weight of "Q–43 Ester," and 0.5 part by weight of benzophenone were admixed. 10 parts by weight of xylene were added to the mixture. The resultant composition was labeled photocurable composition B.

Example 3

200 gms. of "S–102–55" a polyester diol commercially available from the Ruco Division of Hooker Chemical Co. was charged to a 500 ml., 3-neck flask. The material was heated to 110° C. under vacuum and nitrogen maintained at those conditions for one hour, and cooled to about 70° C. 0.1 cc. of dibutyl tin dilaurate was added to the flask. 9 gms. of "Mondur TD–80" a mixture of 80% 2,4-tolylene diisocyanate and 20% 2,6-tolylene diisocyanate commercially available from Mobay Chemical Co. and 9 gms. of allyl isocyanate were placed in a dropping funnel and added to the flask at a moderate rate. The reaction was continued for one hour. The resultant polymer composition was labeled polymer C.

100 parts by weight of polymer C, 6.0 parts by weight "Q–43 Ester," and 0.5 part by weight of benzophenone were admixed. 10 parts by weight of xylene were added to the mixture. The resultant composition was labeled photocurable composition C.

Example 4

280 gms. of "Polymeg 3028" (which is poly(tetramethylene) ether) glycol and is commercially available from Quaker Oats Co. was charged to a 500 ml., 3-neck flask. The material was heated (20 minutes) to 110° C. under vacuum and nitrogen maintained at those conditions for one hour, and cooled to 70° C. 0.1 cc. of dibutyl tin dilaurate was added to the flask. 16 gms. of allyl isocyanate were placed in a dropping funnel and added to the flask at a moderate rate. These additional operations took about 5 minutes, during which time the temperature rose to 93° C. The reaction was continued for one hour (at about 75° C.). 20 cc. of methyl alcohol was added to the flask. The resultant polymer composition was labeled polymer D.

100 parts by weight of polymer D, 8.0 parts by weight of "Q–43 Ester," and 0.5 part by weight of benzophenone were admixed. 10 parts by weight of xylene were added to the mixture. The resultant composition was labeled photocurable composition D.

Example 5

1,000 gms. of "Polymeg 1000"; 2,000 gms. of "Polymeg 2000" and 1.5 gm. of dibutyl tin dilaurate were thoroughly admixed and then charged to a sealed, atmosphere-evacuated, stirred reactor. "Polymeg 1000" is the trade name for a poly(tetramethylene ether) glycol having a molecular weight of 1000 which is commercially available from Quaker Oats Co. "Polymeg 2000" is the trade name for a poly(tetramethylene ether)glycol having a molecular weight of 2000 which is commercially available from Quaker Oats Co. The reactor was placed under vacuum (less than 2.5 mm. Hg) at 230° F. for two hours. This removed any volatile material from the "Polymeg 1000" and "Polymeg 2000." The reactor and ingredients were cooled to 70° F. 174 gms. of tolylene diisocyanate and 166 gms. of allyl isocyanate were added to the reactor. After the initial exotherm from the isocyanate reaction, the temperature was maintained at 150° F. and nitrogen was introduced to maintain the pressure slightly above 0 p.s.i.g. These conditions were maintained for one hour. The pressure was reduced to less than 2.5 mm. Hg and the temperature was raised to 160° F. for one hour. The resultant, cooled material is termed polymer E.

100 parts by weight of polymer E, 7.7 parts by weight of "Q–43 Ester," and 0.5 part by weight of benzophenone were admixed. 10 parts by weight of xylene were added to the mixture. The resultant composition was labeled photocurable composition E.

Example 6

Photocurable composition A was coated with a drawdown bar onto a 6-mil-thick aluminum plate, the surface of which had been lightly abraded with fine bronze wool to facilitate wetting by water. The photocurable composition layer was about ½-mil thick. A one-mil-thick "Mylar" film was laminated onto the other surface of the photocurable layer. "Mylar" is the trade name for a stabilized transparent polyethylene terephthalate resin film commercially available from E. I. du Pont de Nemours & Co., Inc. A line negative was placed on the "Mylar" film portion of the photocurable element. The element was exposed through the negative to a 275 watt Westinghouse lamp at a distance of 12 inches for five minute. The plate was removed and cooled for ½ minute. The "Mylar" film was slowly peeled from the rest of the element, removing the photocured, positive relief image with it. The uncured photocurable composition adhered to the aluminum plate. This composition was cured by exposure to a U.V. lamp for 3 minutes, which resulted in a lithographic printing plate. This negative plate was dampened with a fountain solution, 7 parts by weight water to one part by weight "Repelex" (commercially available from Addressograph Multigraph Co.). The fountain solution only adhered to the hydrophilic parts of the plate, i.e., aluminum. The plate was then inked with a standard oily newspaper printing ink, which only adhered to the oleophilic photocured relief surfaces. The plates were placed face down on paper and an ink impression was made thereon — an exact reproduction of the negative transparency. The above printing procedure was repeated using water instead of the fountain solution.

Example 7

Example 6 was repeated five times, except that the initial exposure time was ½ minute, 1 minute, 2 minutes, 4 minutes and 8 minutes. The optimum initial exposure time was found to be about 1 minute.

Example 8

Example 6 was repeated except that the aluminum plate was immersed in acetone instead of having its surface abraded with fine bronze wool.

Example 9

Photocurable composition B was coated with a drawdown bar onto a 6-mil-thick aluminum plate, the surface of which had been lightly abraded with fine bronze wool to facilitate wetting by water. The photocurable composition layer was about ½ mil thick. A one-mil-thick "Mylar" film was laminated onto the other surface of the photocurable layer. "Mylar" is the trade name for a stabilized, transparent, polyethylene terephthalate resin film commercially available from E. I. du Pont de Nemours & Co., Inc. A line negative was placed on the "Mylar" film portion of the photocurable element. The element was exposed through the negative to a 275-watt Westinghouse lamp at a distance of 12 inches for five minutes. The plate was removed and cooled for ½ minute. The "Mylar" film was slowly peeled from the rest of the element removing the photocured, positive, relief image with it. The uncured photocurable composition adhered to the aluminum plate. The composition was cured by exposure to a U.V. lamp for 3 minutes, which resulted in a lithographic printing plate. This negative plate was dampened with a fountain solution, 7 parts by weight water to one part by weight "Repelex" (commercially available from Addressograph-Multigraph Co.). The fountain solution only adhered to the hydrophilic parts of the plate, i.e., aluminum. The plate was then inked with a standard oily newspaper printing ink, which only adhered to the oleophilic photocured relief surfaces. The plates were placed face down on paper and an ink impression was made thereon—an exact reproduction of the negative transparency. The above printing procedure was repeated using water instead of the fountain solution.

Example 10

Example 9 was repeated except that the aluminum plate was immersed in acetone instead of having its surface abraded with fine bronze wool.

Example 11

Photocurable composition C was coated with a drawdown bar onto a 6-mil-thick aluminum plate, the surface of which had been lightly abraded with fine bronze wool to facilitate wetting by water. The photocurable composition layer was about ½ mil thick. A one-mil-thick "Mylar" film was laminated onto the other surface of the photocurable layer. "Mylar" is the trade name for a stabilized, transparent, polyethylene terephthalate resin film commercially available from E. I. du Pont de Nemours & Co., Inc. A line negative was placed on the "Mylar" film portion of the photocurable element. The element was exposed through the negative to a 275 watt Westinghouse lamp at a distance of 12 inches for five minutes. The plate was removed and cooled for ½ minute. The "Mylar" film was slowly peeled from the rest of the element removing the photocured, positive, relief image with it. The uncured photocurable composition adhered to the aluminum plate. The composition was cured by exposure to a U.V. lamp for 3 minutes, which resulted in a lithographic printing plate. This negative plate was dampened with a fountain solution, 7 parts by weight water to one part by weight "Repelex" (commercially available from Addressograph-Multigraph Co.). The fountain solution only adhered to the hydrophilic parts of the plate, i.e., aluminum. The plate was then inked with a standard oily newspaper printing ink, which only adhered to the oleophilic photocured relief surfaces. The plates were placed face down on paper and an ink impression was made thereon—an exact reproduction of the negative transparency. The above printing procedure was repeated using water instead of the fountain solution.

Example 12

Example 11 was repeated except that the aluminum plate was immersed in acetone instead of having its surface abraded with fine bronze wool.

Example 13

Photocurable composition D was coated with a drawdown bar onto a 6-mil-thick aluminum plate, the surface of which had been lightly abraded with fine bronze wool to facilitate wetting by water. The photocurable composition layer was about ½ mil thick A one-mil-thick "Mylar" film was laminated onto the other surface of the photocurable layer. "Mylar" is the trade name for a stabilized, transparent, polyethylene terephthalate resin film commercially available from E. I. du pont de Nemours & Co., Inc. A line negative was placed on the "Mylar" film portion of the photocurable element. The element was exposed through the negative to a 275 watt RS Westinghouse sunlamp at a distance of 12 inches for five minutes. The plate was removed and cooled for ½ minute. The "Mylar" film was slowly peeled from the rest of the element removing the photocured, positive, relief image with it. The uncured photocurable composition adhered to the aluminum plate. The composition was cured by exposure to a U.V. lamp for 3 minutes, which resulted in a lithographic printing plate. This negative plate was dampened with a fountain solution, 7 parts by weight water to one part by weight "Repelex" (commercially available from Addressograph-multigraph Co.). The fountain solution only adhered to the hydrophilic parts of the plate, i.e., aluminum. The plate was then inked with a standard oily newspaper printing ink, which only adhered to the oleophilic photocured relief surfaces. The plates were placed face down on paper and an ink impression was made thereon—an exact reproduction of the negative transparency. The above printing procedure was repated using water instead of the fountain solution.

Example 14

Example 13 was repeated except that the aluminum plate was immersed in acetone instead of having its surface abraded with fine bronze wool.

Example 15

Example 13 was repeated except that the aluminum plate was curved. The photocured curved element was placed on a rotary lithographic printing press and good quality reproductions of the relief image was obtained.

Example 16

Example 13 was repeated except that a halftone negative transparency was used during the initial exposure of the photocurable element.

Example 17

Photocurable composition E was coated with a draw-down bar onto a 6-mil-thick aluminum plate, the surface of which has been lightly abraded with fine bronze wool to facilitate wetting by water. The photocurable composition layer was about ½ mil thick. A one-mil-thick "Mylar" film was laminated onto the other surface of the photocurable layer. "Mylar" is the trade name for a stabilized, transparent, polyethylene terephthalate resin film commercially available from E. I. du Pont de Nemours & Co., Inc. A line negative was placed on the "Mylar" film portion of the photocurable element. The element was exposed through the negative to a 275-watt RS Westinghouse sunlamp at a distance of 12 inches for five minutes. The plate was removed and cooled for ½ minute. The "Mylar" film was slowly peeled from the rest of the element removing the photocured, positive, relief image with it. The uncured photocurable composition adhered to the aluminum plate. The composition was cured by exposure to a U.V. lamp for 3 minutes, which resulted in a lithographic printing plate. This negative plate was dampened with a fountain solution, 7 parts by weight water to one part by weight "Repelex" (commercially available from Addressographic-Multigraph Co.). The fountain solution only adhered to the hydrophilic parts of the plate, i.e., aluminum. The plate was then inked with a standard oily newspaper printing ink, which only adhered to the oleophilic photocured relief surfaces. The plates were placed face down on paper and an ink impression was made thereon—an exact reproduction of the negative transparency. The above printing procedure was repeated using water instead of the fountain solution.

Example 18

Example 17 was repeated except that the aluminum plate was immersed in acetone instead of having its surface abraded with fine bronze wool.

Example 19

647 gms. (0.1 mole) of "experimental polyol 220" which is a poly (propyleneether) triol commercially available from Wyandotte Chemical Co. (M.W.=6,473; USC=1,100) and 0.3 gm. of dibutyl tin dilaurate were added to a one-liter resin kettle. The material was heated to 110° C. held there for one hour, and cooled to 60° C. 25.9 gm. (0.3 mole) of allyl isocyanate were placed in a funnel and added dropwise to the resin kettle. During the addition of the allyl isocyanate, which took 12 minutes, and the subsequent reaction period, the temperature was kept between 60° and 65° C. The NCO content after 15 minutes was 1.30 mg. NCO/gm.; and after 25 minutes, it was 7.01 mg. NCO/gm. The polymer was then subjected to vacuum for one hour at 70° C. The resultant polymer composition was labeled polymer F. The initial viscosity of polymer F was 1,400 cps. (at 30° C.) and the viscosity after 8 days was 1,400 cps. (at 30° C.).

100 parts by weight of polymer F, 32.5 parts by weight of "Q–43 Ester," 0.5 part by weight of benzophenone, and 100 parts by weight of "Cellosolve" acetate (which is a trade name for ethylene glycol monoethyl ether acetate) were admixed. The resultant composition was labeled photocurable composition F.

Photocurable composition F was coated onto "Stark" grained litho wipe-on plates (sold by Stack Company) to give a dry film thickness of less than 0.5 mil. The solvent was removed. A "Mylar" sheet (top layer) was placed on the photocurable layer. The photocurable element was exposed through that "Mylar" top layer and a line negative to a 275 watt RS Sylvania Sunlamp for 4 minutes at a distance of 12 inches. The "Mylar" top layer was peeled away from the rest of the element, but none of the photocurable composition, photocured or uncured, adhered to the separated top layer. This demonstrates that the adhesion factors must be as stated in the aforegoing portion of this specification, or else, the photocured and uncured portions will not separate when the outside layers are peeled apart. The uncured photocurable composition was removed by washing with water for five minutes, leaving a relief, negative image on an aluminum background. The plate was wetted with "Repelex" fountain solution and inked. The photocured relief image on the plate accepted the ink and the aluminum background repelled it.

Example 20

Example 13 was repeated except that a halftone negative transparency was used in place of the line negative transparency. The aluminum support, and attached relief image, was a negative with the resultant relief image being oleophilic and the uncovered portions of the surface of the aluminum support being hydrophilic.

Example 21

Example 13 was repeated except that the "Mylar" top cover was laminated (under 50 p.s.i. pressure) onto the rest of the assembly at a temperature of 50° C. The aluminum support, and attached relief image, was a negative with the resultant relief image being oleophilic and the uncovered portions of the surface of the aluminum support being hydrophilic.

Example 22

Example 13 was repeated except that 8.5 parts of trimethylolpropane tris ($\beta$-mercaptopropionate) was used in place of pentaerythritol tetrakis ($\beta$-mercaptopropionate). The aluminum support, and attached relief image, was a negative with the resultant relief image being oleophilic and the uncovered portions of the surface of the aluminum support being hydrophilic.

Example 23

Example 13 was repeated except that half of the pentaerythritol tetrakis (β-mercaptopropionate) was replaced with 4.0 parts of ethylene glycol bis (β-mercaptopropionate). The aluminum support, and attached relief image, was a negative with the resultant relief image being oleophilic and the uncovered portions of the surface of the aluminum support being hydrophilic.

Example 24

Example 13 was repeated except that 9.0 parts of trimethylolpropane tris (thioglycolate) was used in place of pentaerythritol tetrakis (β-mercaptopropionate). The aluminum support, and attached relief image, was a negative with the resultant relief image being oleophilic and the uncovered portions of the surface of the aluminum support being hydrophilic.

Example 25

Example 13 was repeated except that 9.0 parts of pentaerythritol tetrakis (thioglycolate) was used in place of pentaerythritol tetrakis (β-mercaptopropionate). The aluminum support, and attached relief image, was a negative with the resultant relief image being oleophilic and the uncovered portions of the surface of the aluminum support being hydrophilic.

Example 26

Example 13 was repeated except that 80 parts of polymer G was used in place of polymer D. Polymer G was prepared as follows: 458 gms. (0.23 mole) of a commercially available liquid polymeric diisocyanate sold under the trade name "Adiprene L–100" by E. I. du Pont de Nemours & Co. was charged to a dry resin kettle maintained under a nitrogen atmosphere and equipped with a condenser, stirrer, thermometer, and gas inlet and outlet. 37.8 gms. (0.65 mole) of allyl alcohol was charged to the kettle and the reaction was continued for 17 hours with stirring at 100° C. Thereafter the nitrogen atmosphere was removed and the kettle was evacuated 8 hours at 100° C. 50 cc. dry benzene was added to the kettle and the reaction product was azeotroped with benzene to remove the unreacted alcohol. This allyl-terminated liquid polymer had a molecular weight of approximately 2100, and was labeled polymer G.

The aluminum support, and attached relief image, was a negative with the resultant relief image being oleophilic and the uncovered portions of the surface of the aluminum support being hydrophilic.

Example 27

Example 13 was repeaed except that 75 parts of polymer H was used in place of polymer D. Polymer H was prepared as follows: 1 mole of commercially available polyethylene glycol having a molecular weight of 1450 and a specific gravity of 1.21 was charged to a resin kettle maintained under nitrogen and equipped with a condenser, stirrer, thermometer and a gas inlet and outlet. 2.9 gms. dibutyl tin dilaurate as a catalyst was charged to the kettle along with 2 moles tolylene-2,4-diisocyanate and 2 moles of allyl alcohol. The reaction was continued with stirring at 60° C. for 2 hours. Thereafter a vacuum of 1 mm. was applied for 2 hours at 60° C. to remove the traces of excess alcohol. This $CH_2{=}CH{-}$ terminated polymer had a molecular weight of approximately 1950 and was labeled polymer H.

The aluminum support, and attached relief image, was a negative with the resultant relief image being oleophilic and the uncovered portions of the surface of the aluminum support being hydrophilic.

Example 28

Example 13 was repeated except that 100 parts of polymer I was used in place of polymer D. Polymer I was prepared as follows: 1500 gms. (0.47 mole) of a linear solid polyester diol having a molecular weight of 3200 and commercially available from Hooker Chemical Corp. under the trade name "Rucoflex S–1011–35" was charged to a 3-liter, 3-necked flask and heated to 110° C. under vacuum and nitrogen for 1 hour with stirring. 83 gms. of allyl isocyanate having a molecular weight of 83.1 and commercially available from Upjohn Co. was added to the flask along with 0.3 cc. of dibutyl tin dilaurate (catalyst), commercially available from J. T. Baker. The reaction was continued at 110° C. with stirring from 1 hour. This allyl-terminated polymer was labeled polymer I.

The aluminum support, and attached relief image, was a negative with the resultant relief image being oleophilic and the uncovered portions of the surface of the aluminum support being hydrophilic.

Example 29

Example 13 was repeated except that 100 parts of polymer J was used in place of polymer D. Polymer J was prepared as follows: 1500 gms. (0.48 mole) of a commercially available linear solid polyester diol, under the trade name "S–106" by Hooker Chemical Corp., was charged to a 3-liter flask equipped with stirrer and heated to 110° C. under vacuum and nitrogen. After 1 hour at that temperature, it was cooled to about 60° C. whereat 81 gms. of allyl isocyanate was slowly added by means of a dropping funnel along with 0.3 cc. of dibutyl tin dilaurate. The mixture was stirred for 1 hour at a temperature in the range 70–80° C. This allyl-terminated polymer was labeled polymer J.

The aluminum support, and attached relief image, was a negative with the resultant relief image being oleophilic and the uncovered portions of the surface of the aluminum support being hydrophilic.

Example 30

Example 13 was repeated except that 100 parts of polymer K was used in place of polymer D. Polymer K was prepared as follows: 300 gms. (0.097 mole) of a commercially available linear solid polyester diol, sold under the trade name "S–108" by Hooker Chemical Co., along with 0.1 cc. of dibutyl tin dilaurate were charged to a 1 liter four-necked flask equipped with stirrer. The mixture was heated to 110° C. under vacuum and nitrogen and maintained thereat for 1 hour. The mixture was then cooled to 60° C. whereat 16 gms. of allyl isocyanate was added and the mixture was heated to 75° C. with stirring and maintained thereat for 1 hour. This allyl-terminated polymer was labeled polymer K.

The aluminum support, and attached relief image, was a negative with the resultant relief image being oleophilic and the uncovered portions of the surface of the aluminum support being hydrophilic.

Example 31

Example 13 was repeated except that 80 parts of polymer L was used in place of polymer D. Polymer L was prepared as follows: 240 gms. (.12 mole) of a polyether diol, i.e., poly(tetramethylene ether) glycol, having a molecular weight of 1990 commercially available from the Quaker Oats Co. under the trade name "Polymeg 1990," were charged to a 500 ml. three-necked flask equipped with stirrer. The flask was heated to 110° C. under vacuum and nitrogen and maintained thereat for 1 hour. The flask was then cooled to approximately 70° C. whereat 0.1 cc. of dibutyl tin dilaurate along with 14 gms. (0.25 mole) of allyl alcohol were added to the flask and stirring was continued for 15 minutes. Thereafter 42 gms. (0.24 mole) of tolylene diisocyanate (molecular weight 174) commercially available from Mobay Chemical Co. under the trade name "Mondur TD–80" was added to the flask by means of a dropping funnel and the reaction was continued with stirring for 1 hour. This allyl-terminated polymer was labeled polymer L.

The aluminum support, and attached relief image, was a negative with the resultant relief image being oleophilic and the uncovered portions of the surface of the aluminum support being hydrophilic.

Example 32

Example 13 was repeated except that 125 parts of polymer M was used in place of polymer D. Polymer M was prepared as follows: 600 gms. (0.11 mole) of a polypropylene glycol called under the trade name "Triol 6000" by Union Carbide Corp. was charged to a 1 liter resin kettle along with 0.3 gm. of dibutyl tin dilaurate. The kettle was heated to 110° C. under vacuum and maintained thereat for 1 hour. The kettle was then cooled to approximately 50° C. whereat 28.4 gms. (0.342 mole) of allyl isocyanate was added slowly to keep the exotherm between 60–67° C. NCO content after 20 minutes was 0.62 mg. NCO/gm. This polymer was then placed under vacuum at 70° C. for 1 hour followed by an additional vacuuming at 90° C. for 2 hours. This allyl-terminated polymer was labeled polymer M.

The aluminum support, and attached relief image, was a negative with the resultant relief image being oleophilic and the uncovered portions of the surface of the aluminum support being hydrophilic.

Example 33

Example 13 was repeated except that 75 parts of polymer N was used in place of polymer D. Polymer N was prepared as follows: 600 gms. (0.22 mole) of a polypropylene glycol having a molecular weight of 2960 and under the trade name "Triol 3000" by Union Carbide Corp. was charged to a 1-liter resin kettle along with 0.3 gm. of dibutyl tin dilaurate. The kettle was heated to 110° C. under vacuum and maintained thereat for 1 hour. The kettle was cooled to 60° C. whereat 40 gms. (0.48 mole) of allyl isocyanate was added dropwise from a dropping funnel to the reaction mixture. After 20 minutes the NCO content was 0.80 mg. NCO/gm. The thus formed prepolymer was then maintained under vacuum at 70° C. for 1 hour followed by 2 hours at 90° C. This allyl-terminated polymer was labeled polymer N.

The aluminum support, and attached relief image, was a negative with the resultant relief image being oleophilic and the uncovered portions of the surface of the aluminum support being hydrophilic.

Example 34

Example 13 was repeated except that 1.5 parts of cyclohexanone was used as the photoinitiator in place of benzophenone. The aluminum support, and attached relief image, was a negative with the resultant relief image being oleophilic and the uncovered portions of the surface of the aluminum support being hydrophilic.

Example 35

Example 13 was repeated except that 1.5 parts of dibenzosuberone was used as the photoinitiator in place of benzophenone. The aluminum support, and attached relief image, was a negative with the resultant relief image being oleophilic and the uncovered portions of the surface of the aluminum support being hydrophilic.

Example 36

Example 13 was repeated except that 1.5 parts of methyl ethyl ketone was used as the photoinitiator in place of benzophenone. The aluminum support, and attached relief image, was a negative with the resultant relief image being oleophilic and the uncovered portions of the surface of the aluminum support being hydrophilic.

Example 37

Example 13 was repeated except that (a) a 4-mil thick "Mylar" sheet was used in place of the aluminium support, (b) 280 grams of "S–102–55" were used in place of "Polymeg 3028," and (c) the photocurable composition contained 4 parts of fine particles of silica gel. The "Mylar" support, and the attached relief image was a negative, with the resultant relief image being relatively hydrophilic and the uncovered portions of the "Mylar" support being relatively oleophilic.

Example 38

23.8 grams of pentaerythritol tetrakis(β-mercaptopropionate), 25.6 grams of the reaction product of one mole of 1,4-butanediol with two moles of allyl isocyanate; and 0.5 gram of benzophenone were thoroughly admixed. The photocurable composition was coated onto a U.V. transparent "Mylar" film support which was 5-mils thick. The top cover was placed on the photocurable composition layer. The edges of the element were sealed with adhesive tape. The element was exposed through the top cover to a Westinghouse Sunlamp (275 watt RS) at a distance of 9 inches through a negative line transpaerncy for 15 minutes at a temperature of 30° C. In the imaged areas the photocurable composition hardened to a solid. Upon separating the "Mylar" support and cover, the cured portion of the photocurable composition stuck to the top cover, forming a positive. The film support was exposed (not imagewise) for one minute to the sunlamp, which photocured the photocurable composition adhering imagewise thereto. Thus both a photocured positive and negative were produced. This example illustrates the use of a monomeric polythiol and a monomeric polyene in the preparation of the photocurable composition from which lithographic printing plates can be produced.

Example 39

27 grams of triacrylate of the reaction product of one mole of trimethylol propane with 20 moles of ethylene oxide, 9 grams of pentaerythritol tetrakis(β-mercaptopropionate), and 0.5 gram of benzophenone were admixed. Example 38 was repeated, except that the above photocurable composition was substituted for the photocurable composition used in Example 38. Thus, both a photocured positive and negative were produced. This example illustrates the use of a reactive ene group conjugated with another double bond grouping (C=O).

Example 40

50 grams of a liquid polybutadiene derivative having a molecular weight of about 2200 and a double bond distribution consisting of about 60% trans-1,4; about 20% cis-1,4; and about 20% vinyl-1,2, and which is commercially available from Sinclair Petrochemicals, Inc., under the trade name "Poly B–D–R 45–M"; and 0.5 gram of benzophenone were admixed. Example 38 was repeated, except that the above photocurable composition was substituted for the photocurable composition used in Example 38. Thus, both a photocured positive and negative were produced.

Example 41

10 grams of "Gentro 1002," (i.e., the tradename for a solid SBR rubber containing approximately 23.5 percent styrene and 76.5 percent butadiene which is commercially available from General Tire and Rubber Co.), which was dissolved in 50 grams of Decalin (as a solvent), 1 gram of pentaerythritol tetrakis(β-mercaptopropionate), 0.5 gram of benzophenone, and 0.1 gram of silica (Hi Sil 233), added as a thickening agent, were admixed. Example 38 was repeated, except that the above photocurable composition was substituted for the photocurable composition used in Example 38. Thus, both a positive and a negative were produced.

Example 42

50 grams of "Dion Polymercaptan Resin DPM–1002" which is commercially available from Diamond Alkali Company, and is a thiol terminated liquid polymer having a functionality of 2 to 3 and a molecular weight of about 5000; 2.5 grams of triallyl cyanurate, and 0.5 gram of benzophenone were admixed. Example 38 was repeated, except that the above photocurable composition was substituted for the photocurable composition used in Example 38. Thus, both a positive and a negative were produced. This example illustrated the use of a photocurable composition containing a monomeric polyene and a polymeric polythiol.

Example 43

Example 38 was repeated, except that the photocurable composition contained an admixture of 50 grams of the polymeric polyene used in Example 33; 60 grams of the polymeric polythiol used in Example 42; and 0.5 gram of benzophenone. This example illustrated the use of a photocurable composition containing a polymeric polyene and a polymeric polythiol.

Example 44

The effect of benzophenone concentration upon the photocuring time of photocurable compositions containing carbon black is given in Table III. From the results of that data, it is shown that the photocuring time for photocurable compositions containing pigments or dyes can be reduced by increasing the quantity of the photocuring rate accelerator in the photocurable composition.

TABLE III [4].—EFFECT OF BENZOPHENONE CONCENTRATION OF PHOTOCURING TIME

| | | | | |
|---|---|---|---|---|
| Photocurable composition C [1, 2] | 10 | 10 | 10 | 10 |
| "Sterling FT" [1, 3] | 2.5 | 2.5 | 2.5 | 2.5 |
| Additional benzophenone [1] | 0.5 | 1.0 | 3 | 5 |
| Photocuring time (minutes) | 5-10 | 5-10 | 5 | 3 |

[1] Parts by weight.
[2] Prepared as in Example 13.
[3] Tradename for a carbon black.
[4] The blending was achieved on a Hoover Muller (pigment dispersing machine) to achieve a homogeneous mixture. The photocurable compositions (containing carbon blacks) were coated (layer thickness was 0.5 to 1 mil) into a polymer film (2-4 mils thick). The imagewise exposure was through a line negative by a Westinghouse 275 watt RS sunlamp at a distance of one foot. The uncured portions were removed.

Example 45

Example 37 was repeated except that a positive transparency was used during the initial exposure of the photocurable element. This example illustrates the use of this invention in making a positive-working lithographic plate.

What is claimed is:

1. A process for preparing a lithographic printing plate containing a relief image from a layer of a photocurable composition consisting essentially of 2–98 parts by weight of said composition of an ethylenically unsaturated polyene containing at least two reactive unsaturated carbon-to-carbon bonds per molecule, 98–2 parts by weight of the composition of a polythiol containing at least two thiol groups per molecule, the total combined functionality of (a) the reactive unsaturated carbon-to-carbon bonds per molecule in the polyene and (b) the thiol groups per molecule in the polythiol being greater than 4, and 0.0005 to 50 percent by weight of said composition of a photocuring rate accelerator, said photocurable composition being laminated between an essentially transparent cover layer and a support layer characterized by the steps of (1) exposing said photocurable composition imagewise to actinic radiation through said essentially transparent cover layer whereby the exposed areas of the photocurable composition are converted to an insoluble hardened cured polythioether which adheres to the essentially transparent cover layer and the unexposed areas of the photocurable composition adhere to the support layer, (2) separating the cover layer from the support layer thereby uncovering portions of the surface of said support layer and said cover layer, said uncovered portions being hydrophilic in relation to said photocurable composition in its cured state, and (3) thereafter exposing the unexposed areas of the photocurable composition adhered to the support layer directly to actinic radiation to form a lithographic printing plate.

2. The process according to claim 1 wherein the uncovered portions of the support and cover layers are oleophilic in relation to the photocurable composition in its cured state.

3. The process according to claim 1 wherein the layer of photocurable composition has a thickness in the range 0.00001 to 0.004 inch.

4. A process as described in claim 1 wherein said layers are separated at room temperature by peeling said layers apart.

5. A process as described in claim 1 wherein said photocurable element is exposed to ultraviolet radiation.

6. A process as described in claim 1 wherein said support layer is transparent.

7. A process as described in claim 1 wherein said cover layer is a solid synthetic polymeric sheet.

8. A process as described in claim 1 wherein said support layer comprises a solid synthetic polymeric sheet.

9. A process as described in claim 1 wherein said support layer is comprised of a solid synthetic polymeric layer with a substrate on the surface which bounds the layer containing the said photocurable composition.

10. A process as described in claim 1 wherein said relief image is oleophilic and said exposed portions of said support layer are hydrophilic.

11. A process as described in claim 1 wherein said relief image is hydrophilic and said exposed portions of said support layer are oleophilic.

12. A process as described in claim 1 wherein said support layer comprises an aluminum layer.

13. A process as described in claim 1 wherein the photocurable composition has a viscosity before exposure of between about 0.25 poise and about 350 poises at or below 70° C.

References Cited

UNITED STATES PATENTS

| | | | |
|---|---|---|---|
| 2,392,294 | 1/1946 | Rust et al. | |
| 2,393,294 | 1/1946 | Crane | 74—24 |
| 2,184,289 | 12/1939 | Dangelmajer | 96—36.3 |
| 2,627,088 | 2/1953 | Alles et al. | 96—33 X |
| 2,948,611 | 8/1960 | Barney | 96—33 X |
| 2,964,423 | 12/1960 | Van Stappen | 96—33 X |
| 3,055,758 | 9/1962 | McDonald | 96—33 X |
| 3,060,026 | 10/1962 | Heiart | 96—28 |
| 3,099,209 | 7/1963 | Damschroder | 96—33 X |
| 3,115,420 | 12/1963 | Centa et al. | 96—33 X |
| 3,145,104 | 8/1964 | Oster et al. | 96—33 |
| 3,186,844 | 6/1965 | Alles et al. | 96—36.3 |
| 3,210,187 | 10/1965 | Thommes | 96—36 X |
| 3,219,633 | 11/1965 | Boussu et al. | 96—33 X |
| 3,264,104 | 8/1966 | Reichel | 96—33 |
| 3,285,951 | 11/1966 | Heiss | 96—33 X |
| 3,297,745 | 1/1967 | Fekete | 96—33 X |
| 3,300,456 | 1/1967 | Hay | 96—33 X |
| 3,306,745 | 2/1967 | Webers | 96—33 X |
| 3,342,593 | 9/1967 | Burg | 96—28 |
| 3,376,136 | 4/1968 | Seide | 96—28 |
| 3,408,191 | 10/1968 | Jeffers | 96—28 |
| 3,427,161 | 2/1969 | Laridon | 96—33 X |
| 3,429,834 | 2/1969 | Vandenberg | 96—33 X |
| 3,441,589 | 4/1969 | Oswald | 96—33 X |

FOREIGN PATENTS

| | | | |
|---|---|---|---|
| 903,849 | 8/1962 | Great Britain | 96—28 |

WILLIAM D. MARTIN, Primary Examiner
M. R. P. PERRONE, Assistant Examiner

U.S. Cl. X.R.

96—86 P, 115 P; 101—451, 456, 457, 458, 459, 460, 462